(12) United States Patent
Lim et al.

(10) Patent No.: US 11,640,938 B2
(45) Date of Patent: May 2, 2023

(54) SEMICONDUCTOR DEVICE FORMED ON SOI SUBSTRATE

(71) Applicant: DB HITEK CO., LTD., Seoul (KR)

(72) Inventors: Ki Won Lim, Gyeonggi-do (KR); Jin Hyo Jung, Gyeonggi-do (KR); Hae Taek Kim, Gyeonggi-do (KR); Seung Hyun Eom, Chungcheongbuk-do (KR); Ja Geon Koo, Chungcheongbuk-do (KR); Hyun Joong Lee, Daejeon (KR); Sang Yong Lee, Chungcheongbuk-do (KR)

(73) Assignee: DB HITEK CO., LTD., Seoul (KR)

( * ) Notice: Subject to any disclaimer, the term of this patent is extended or adjusted under 35 U.S.C. 154(b) by 0 days.

(21) Appl. No.: 17/460,998

(22) Filed: Aug. 30, 2021

(65) Prior Publication Data
US 2022/0068793 A1 Mar. 3, 2022

(30) Foreign Application Priority Data
Aug. 31, 2020 (KR) .................. 10-2020-0109978

(51) Int. Cl.
*H01L 21/00* (2006.01)
*H01L 23/528* (2006.01)
*H01L 27/12* (2006.01)

(52) U.S. Cl.
CPC ........ *H01L 23/528* (2013.01); *H01L 27/1203* (2013.01)

(58) Field of Classification Search
CPC ........................ H01L 23/528; H01L 27/1203; H01L 23/5222
See application file for complete search history.

(56) References Cited

U.S. PATENT DOCUMENTS

| | | | | |
|---|---|---|---|---|
| 5,281,838 A * | 1/1994 | Okumura | .......... | H01L 27/10805 257/385 |
| 5,607,866 A * | 3/1997 | Sato | .................... | H01L 21/8249 438/207 |
| 5,965,922 A * | 10/1999 | Matsui | .................... | H01L 27/11 257/E27.098 |
| 7,723,721 B2 * | 5/2010 | Udagawa | ............ | H01L 27/3276 257/40 |
| 10,236,364 B1 * | 3/2019 | Cheng | .................... | H01L 29/456 |
| 10,868,023 B2 * | 12/2020 | Lee | ........................ | H01L 21/266 |
| 10,879,165 B2 * | 12/2020 | Saka | .................... | H01L 23/5225 |

(Continued)

FOREIGN PATENT DOCUMENTS

| | | | | |
|---|---|---|---|---|
| CN | 108028224 A * | 5/2018 | ......... | H01L 21/7682 |
| DE | 112016004700 T5 * | 7/2018 | ......... | H01L 21/7682 |

(Continued)

*Primary Examiner* — Laura M Menz
(74) *Attorney, Agent, or Firm* — Patterson Thuente IP

(57) ABSTRACT

A semiconductor device is disclosed. The semiconductor device includes impurity regions formed in surface portions of a substrate, gate structures formed on surface portions of the substrate between the impurity regions, a first insulating layer formed on the impurity regions and the gate structures, first wiring patterns formed on the first insulating layer, and first contact patterns connecting the impurity regions and the first wiring patterns through the first insulating layer, and the first wiring patterns are arranged in a zigzag shape.

10 Claims, 4 Drawing Sheets

(56) References Cited

U.S. PATENT DOCUMENTS

| | | | |
|---|---|---|---|
| 2008/0160706 A1* | 7/2008 | Jung | H01L 29/7833 257/E21.409 |
| 2010/0176457 A1* | 7/2010 | Jin | H01L 29/7843 257/E21.639 |
| 2016/0043080 A1* | 2/2016 | Watanabe | H01L 27/0207 438/283 |
| 2016/0099258 A1* | 4/2016 | Yoneda | H01L 27/124 257/43 |
| 2017/0213848 A1* | 7/2017 | Nishihori | H01L 29/7843 |
| 2018/0277479 A1* | 9/2018 | Saka | H01L 21/84 |
| 2020/0373321 A1* | 11/2020 | Kwak | H01L 27/11575 |
| 2021/0066186 A1* | 3/2021 | Saka | H01L 21/84 |
| 2021/0210425 A1* | 7/2021 | Lee | H01L 27/11519 |
| 2021/0343342 A1* | 11/2021 | Lee | H01L 27/11556 |
| 2022/0068793 A1* | 3/2022 | Lim | H01L 23/5222 |

FOREIGN PATENT DOCUMENTS

| | | | | |
|---|---|---|---|---|
| KR | 1020100131914 | | 12/2010 | |
| KR | 1020190087052 | | 7/2019 | |
| WO | WO-2017064937 A1 * | 4/2017 | | H01L 21/7682 |

* cited by examiner

SEMICONDUCTOR DEVICE FORMED ON SOI SUBSTRATE

CROSS-REFERENCE TO RELATED APPLICATION

This application claims the priority benefit of Korean Patent Application No. 10-2020-0109978, filed on Aug. 31, 2020, and all the benefits accruing therefrom under 35 U.S.C. § 119, the contents of which are incorporated by reference in their entirety.

BACKGROUND

The present disclosure relates to a semiconductor device formed on a Silicon On Insulator (SOI) substrate. More specifically, the present disclosure relates to a semiconductor device including SOI transistors that can be used as a Radio Frequency (RF) switch device.

In general, a semiconductor device such as transistors formed on an SOI substrate may be used as an RF switch device. For example, a plurality of serially coupled SOI transistors may be used as an RF switch capable of handling the power levels in a portable electronic device.

The Figure Of Merit (FOM) of the semiconductor device may be determined by the resistance ($R_{on}$) in the on-state and the capacitance ($C_{off}$) in the off-state. However, when wiring patterns of the semiconductor device are arranged adjacent to each other, the off-state capacitance of the semiconductor device may increase, and thereby, the FOM of the semiconductor device may be deteriorated.

SUMMARY

The present disclosure provides a semiconductor device capable of reducing the off-state capacitance.

In accordance with an aspect of the present disclosure, a semiconductor device may include a plurality of impurity regions formed in surface portions of a substrate, the impurity regions being arranged in a first direction and extending parallel with one another in a second direction perpendicular to the first direction, a plurality of gate structures formed on surface portions of the substrate between the impurity regions and extending parallel to the impurity regions, a first insulating layer formed on the impurity regions and the gate structures, a plurality of first wiring patterns formed on the first insulating layer and extending parallel to the impurity regions, and a plurality of first contact patterns connecting the impurity regions and the first wiring patterns through the first insulating layer and extending parallel to the impurity regions. Particularly, the first wiring patterns may have a length shorter than that of the first contact patterns.

In accordance with some embodiments of the present disclosure, the impurity regions may have a length shorter than that of the gate structures.

In accordance with some embodiments of the present disclosure, the first contact patterns may have a length shorter than that of the impurity regions and are arranged in the first direction.

In accordance with some embodiments of the present disclosure, the first wiring patterns may be arranged in a zigzag shape in the first direction.

In accordance with some embodiments of the present disclosure, the substrate may include a lower semiconductor layer, an upper semiconductor layer, and a buried insulating layer disposed between the lower semiconductor layer and the upper semiconductor layer.

In accordance with some embodiments of the present disclosure, the impurity regions may be formed in surface portions of the upper semiconductor layer.

In accordance with some embodiments of the present disclosure, the semiconductor device may further include a well region formed in the upper semiconductor layer, and the impurity regions may be formed on the well region.

In accordance with some embodiments of the present disclosure, the semiconductor device may further include a connecting structure connected with end portions of the gate structures and extending in the first direction, and a gate contact region connected with an edge portion of the connecting structure.

In accordance with some embodiments of the present disclosure, the semiconductor device may further include a well region formed in the substrate and a well contact region connected with the well region. In such case, the impurity regions may be formed on the well region, and the connecting structure may be formed on the well contact region.

In accordance with some embodiments of the present disclosure, the semiconductor device may further include a second insulating layer formed on the first insulating layer and the first wiring patterns, a plurality of second wiring patterns formed on the second insulating layer, and a plurality of second contact patterns connecting the first wiring patterns and the second wiring patterns through the second insulating layer.

In accordance with another aspect of the present disclosure, a semiconductor device may include a plurality of impurity regions formed in surface portions of a substrate, the impurity regions being arranged in a first direction and extending parallel with one another in a second direction perpendicular to the first direction, a plurality of gate structures formed on surface portions of the substrate between the impurity regions and extending parallel to the impurity regions, a first insulating layer formed on the impurity regions and the gate structures, a plurality of first wiring patterns formed on the first insulating layer and extending parallel to the impurity regions, and a plurality of first contact patterns connecting the impurity regions and the first wiring patterns through the first insulating layer and extending parallel to the impurity regions. Particularly, the first wiring patterns may be arranged in a zigzag shape in the first direction.

In accordance with some embodiments of the present disclosure, the first contact patterns may have a length shorter than that of the first wiring patterns.

In accordance with some embodiments of the present disclosure, the first contact patterns may be arranged in a zigzag shape in the first direction.

In accordance with some embodiments of the present disclosure, the impurity regions may have a length shorter than that of the gate structures.

In accordance with some embodiments of the present disclosure, the substrate may include a lower semiconductor layer, an upper semiconductor layer, and a buried insulating layer disposed between the lower semiconductor layer and the upper semiconductor layer. In such case, the impurity regions may be formed in surface portions of the upper semiconductor layer.

In accordance with some embodiments of the present disclosure, the semiconductor device may further include a well region formed in the upper semiconductor layer, and the impurity regions may be formed on the well region.

In accordance with some embodiments of the present disclosure, the semiconductor device may further include a device isolation pattern formed on the buried insulating layer and configured to define the well region.

In accordance with some embodiments of the present disclosure, the semiconductor device may further include a connecting structure connected with end portions of the gate structures and extending in the first direction, and a gate contact region connected with an edge portion of the connecting structure.

In accordance with some embodiments of the present disclosure, the semiconductor device may further include a well region formed in the substrate and a well contact region connected with the well region. In such case, the impurity regions may be formed on the well region, and the connecting structure may be formed on the well contact region.

In accordance with some embodiments of the present disclosure, the semiconductor device may further include a device isolation pattern formed on the buried insulating layer and configured to define the well region and the well contact region.

In accordance with the embodiments of the present disclosure as described above, the semiconductor device may include a plurality of transistors having a multi-finger structure, and the first contact patterns for connecting the impurity regions and the first wiring patterns may extend along the impurity regions. Accordingly, the on-state resistance of the semiconductor device may be significantly reduced as compared with contact plugs in the prior art. Further, the first wiring patterns may be arranged in a zigzag shape, thereby increasing a distance between the first wiring patterns. As a result, the off-state capacitance of the semiconductor device may be significantly reduced, and the FOM of the semiconductor device may be greatly improved.

The above summary of the present disclosure is not intended to describe each illustrated embodiment or every implementation of the present disclosure. The detailed description and claims that follow more particularly exemplify these embodiments.

BRIEF DESCRIPTION OF THE DRAWINGS

Embodiments can be understood in more detail from the following description taken in conjunction with the accompanying drawings, in which.

Figure 1:
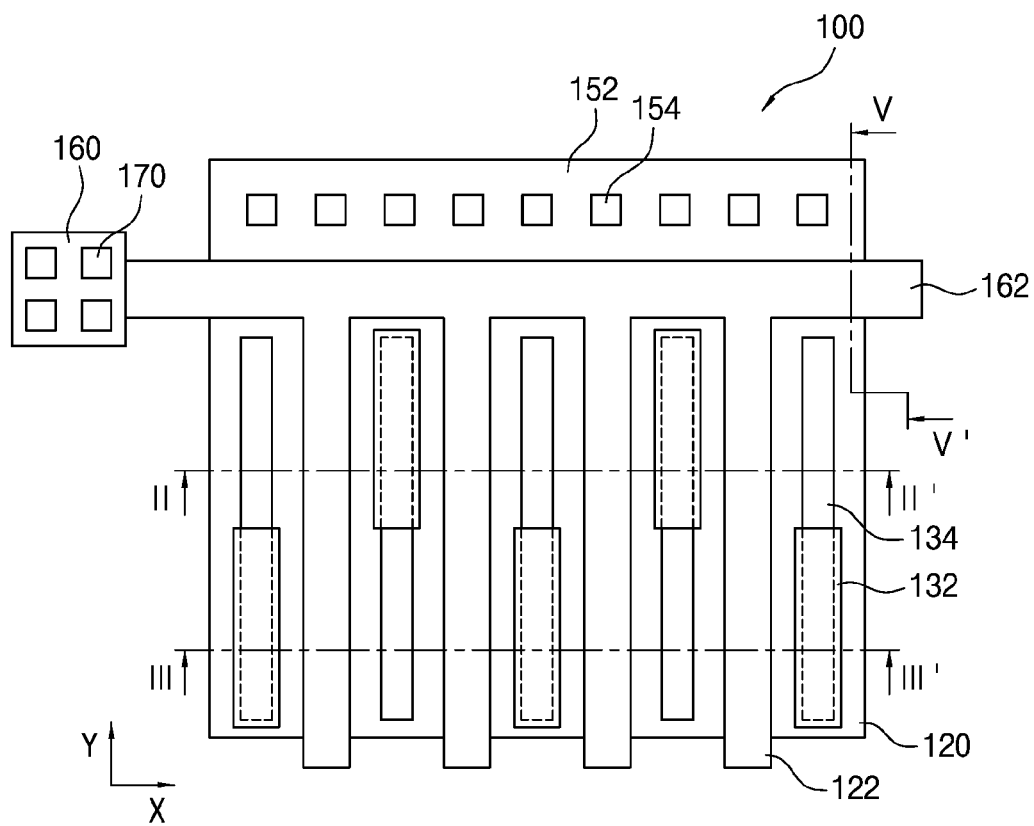
FIG. 1 is a schematic plan view illustrating a semiconductor device in accordance with an embodiment of the present disclosure.

While various embodiments are amenable to various modifications and alternative forms, specifics thereof have been shown by way of example in the drawings and will be described in detail. It should be understood, however, that the intention is not to limit the claimed inventions to the particular embodiments described. On the contrary, the intention is to cover all modifications, equivalents, and alternatives falling within the spirit and scope of the subject matter as defined by the claims.

DETAILED DESCRIPTION

Hereinafter, embodiments of the present invention are described in more detail with reference to the accompanying drawings. However, the present invention is not limited to the embodiments described below and is implemented in various other forms. Embodiments below are not provided to fully complete the present invention but rather are provided to fully convey the range of the present invention to those skilled in the art.

In the specification, when one component is referred to as being on or connected to another component or layer, it can be directly on or connected to the other component or layer, or an intervening component or layer may also be present. Unlike this, it will be understood that when one component is referred to as directly being on or directly connected to another component or layer, it means that no intervening component is present. Also, though terms like a first, a second, and a third are used to describe various regions and layers in various embodiments of the present invention, the regions and the layers are not limited to these terms.

Terminologies used below are used to merely describe specific embodiments, but do not limit the present invention. Additionally, unless otherwise defined here, all the terms including technical or scientific terms, may have the same meaning that is generally understood by those skilled in the art.

Embodiments of the present invention are described with reference to schematic drawings of ideal embodiments. Accordingly, changes in manufacturing methods and/or allowable errors may be expected from the forms of the drawings. Accordingly, embodiments of the present invention are not described being limited to the specific forms or areas in the drawings, and include the deviations of the forms. The areas may be entirely schematic, and their forms may not describe or depict accurate forms or structures in any given area, and are not intended to limit the scope of the present invention.

Korean Patent Application Laid-Open No. 10-2019-0087052, having US counterpart application U.S. Ser. No. 16/248,999 and commonly owned by the Applicant to the present application, discloses a semiconductor device formed on an SOI substrate. The semiconductor device may include a plurality of transistors having a multi-finger structure. Specifically, the semiconductor device may include a plurality of impurity regions extending in a first direction and usable as source/drain regions, and a plurality of gate structures disposed between the impurity regions. Further, the semiconductor device may include a first insulating layer formed on the impurity regions and the gate structures, first wiring patterns formed on the first insulating layer, and contact plugs connecting the impurity regions and the first wiring patterns through the first insulating layer.

Figure 2:
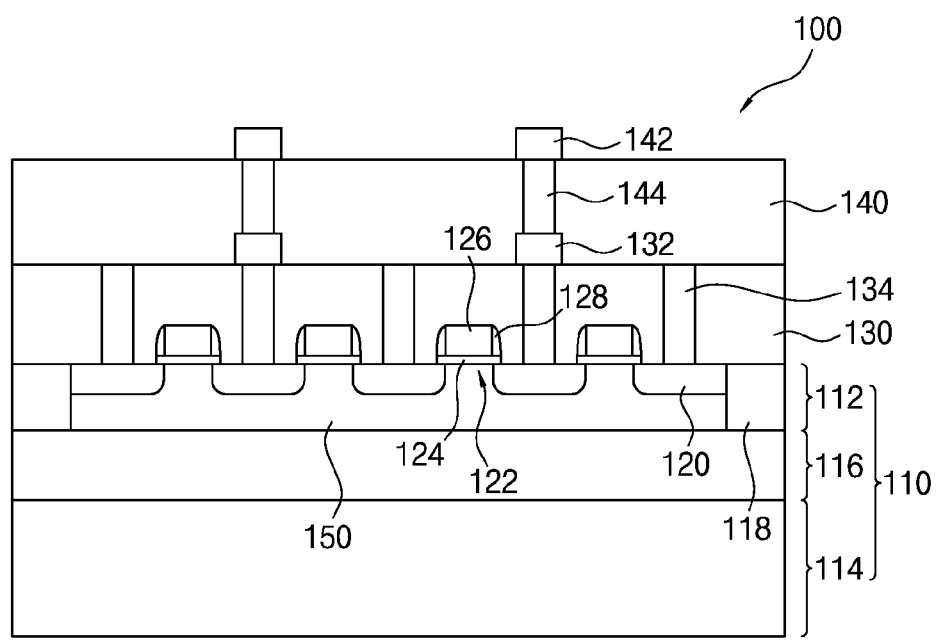
FIG. 2 is a schematic cross-sectional view taken along the line II-II' as shown in FIG. 1.
Figure 3:
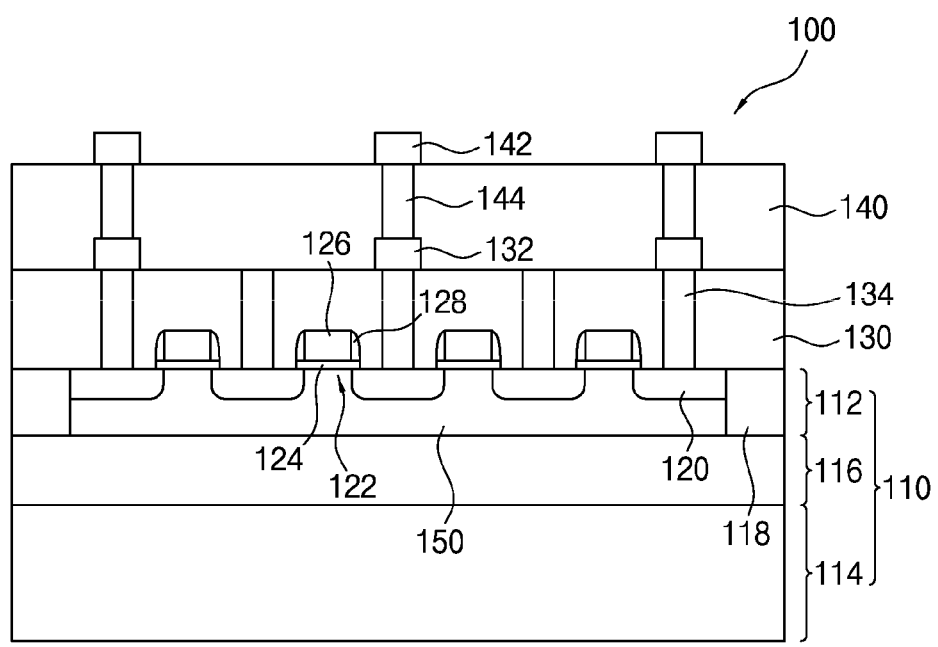
FIG. 3 is a schematic cross-sectional view taken along the line III-III' as shown in FIG. 1.

FIG. 1 is a schematic plan view illustrating a semiconductor device in accordance with an embodiment of the present disclosure, FIG. 2 is a schematic cross-sectional view taken along the line II-II' as shown in FIG. 1, and FIG. 3 is a schematic cross-sectional view taken along the line III-III' as shown in FIG. 1.

Referring to FIGS. 1 to 3, a semiconductor device 100, in accordance with an embodiment of the present disclosure, may include a plurality of impurity regions 120 formed in surface portions of a substrate 110, a plurality of gate structures 122 formed on surface portions of the substrate 110 between the impurity regions 120, a first insulating layer 130 formed on the impurity regions 120 and the gate structures 122, a plurality of first wiring patterns 132 formed on the first insulating layer 130, and a plurality of first contact patterns 134 connecting the impurity regions 120 and the first wiring patterns 132 through the first insulating layer 130.

Further, the semiconductor device 100 may include a second insulating layer 140 formed on the first insulating layer 130 and the first wiring patterns 132, a plurality of second wiring patterns 142 formed on the second insulating layer 140, and a plurality of second contact patterns 144 connecting the first wiring patterns 132 and the second wiring patterns 142 through the second insulating layer 140. Meanwhile, for convenience of explanation, the first insulating layer 130, the second insulating layer 140, the second wiring patterns 142, and the second contact patterns 144 are not shown in FIG. 1.

The substrate 110 may be an SOI substrate, and may include an upper semiconductor layer 112, a lower semiconductor layer 114, and a buried insulating layer 116, e.g., a buried oxide layer, disposed between the upper semiconductor layer 112 and the lower semiconductor layer 114.

The impurity regions 120 may function as source/drain regions of the semiconductor device 100, and may be formed in the surface portions of the substrate 110, that is, in surface portions of the upper semiconductor layer 112 through an ion implantation process. Particularly, the impurity regions 120 may be arranged to be spaced apart from each other in a first direction, for example, in an X-axis direction, and may extend parallel to each other in a second direction perpendicular to the first direction, for example, in a Y-axis direction.

The gate structures 122 may extend parallel to the impurity regions 120, that is, parallel to each other in the second direction, and each of the gate structures 122 may include a gate insulating layer 124 formed on a surface portion of the substrate 110, that is, a surface portion of the upper semiconductor layer 112, a gate electrode 126 formed on the gate insulating layer 124, and gate spacers 128 formed on side surfaces of the gate electrode 126.

Figure 4:
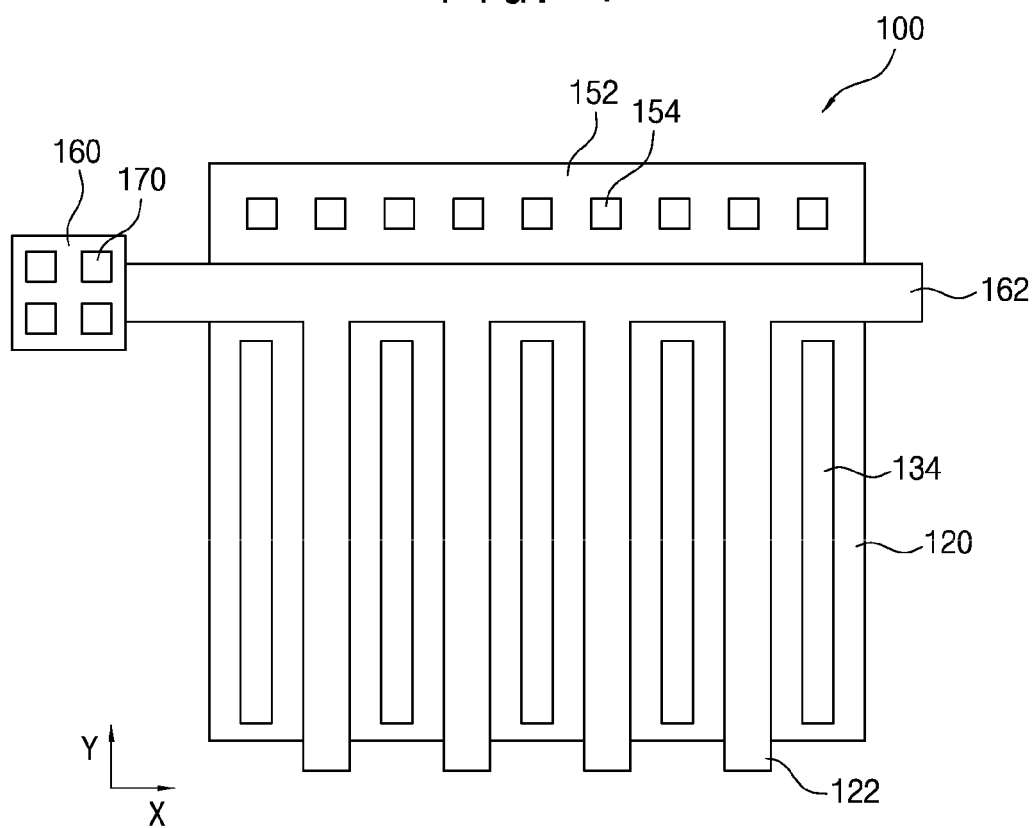
FIG. 4 is a schematic plan view illustrating first contact patterns as shown in FIG. 1.

FIG. 4 is a schematic plan view illustrating first contact patterns as shown in FIG. 1.

Referring to FIG. 4, the first contact patterns 134 may be formed on the impurity regions 120. Particularly, the first contact patterns 134 may be arranged in the first direction, and may extend parallel to the impurity regions 120, that is, parallel to each other in the second direction. Further, the first contact patterns 134 may have a slightly shorter length than the impurity regions 120. Accordingly, the first contact patterns 134 may have a relatively large cross-sectional area compared to the contact plugs in the prior art, and thus, the on-state resistance of the semiconductor device 100 may be reduced.

Referring again to FIGS. 1 to 3, the first wiring patterns 132 may be formed on the first contact patterns 134, and may extend parallel to the impurity regions 120. Particularly, the first wiring patterns 132 may have a shorter length than the first contact patterns 134, and may be arranged in a zigzag shape in the first direction, that is, in the X-axis direction, as shown in FIG. 1. Accordingly, the distance between the first wiring patterns 132 may be increased, and thus, the off-state capacitance of the semiconductor device 100 may be significantly reduced.

In accordance with an embodiment of the present disclosure, the semiconductor device 100 may include a well region 150 formed in the upper semiconductor layer 112 and a well contact region 152 connected to the well region 150. Further, the semiconductor device 100 may include a gate contact region 160 for applying a gate voltage to the gate structures 122, and a connecting structure 162 for connecting the gate structures 122 and the gate contact region 160. For example, the connecting structure 162 may be connected with end portions of the gate structures 122 and may extend in the first direction, and the gate contact region 160 may be connected with an edge portion of the connecting structure 162.

Further, the semiconductor device 100 may include a device isolation pattern 118 for defining an active region (not shown). The active region may become the well region 150 and the well contact region 152 by an ion implantation process. The device isolation pattern 118 may be formed by a shallow trench isolation (STI) process, and the well region 150 and the well contact region 152 may be defined by the device isolation pattern 118. For example, the upper semiconductor layer 112 may be partially removed to expose the buried insulating layer 116 by an anisotropic etching process, thereby forming a trench (not shown) for forming the device isolation pattern 118. The trench may be filled with an insulating material such as silicon oxide, thereby forming the device isolation pattern 118.

The gate structures 122 may be formed on the well region 150, and the connecting structure 162 may be formed on the well contact region 152. In particular, the connecting structure 162 may extend across the well contact region 152 in the first direction, and both end portions of the connecting structure 162 may be formed on the device isolation pattern 118.

Figure 5:
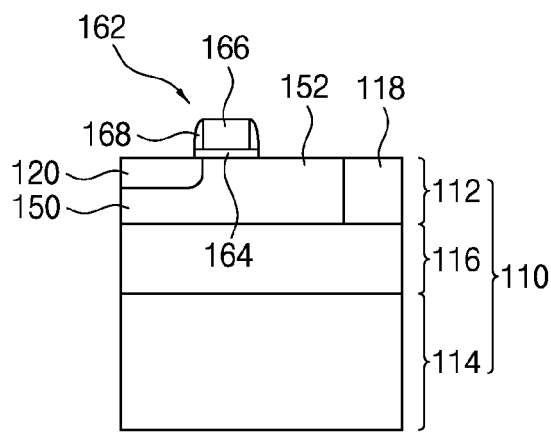
FIG. 5 is a schematic cross-sectional view taken along the line V-V' as shown in FIG. 1 to illustrate a connecting structure as shown in FIG. 1.

FIG. 5 is a schematic cross-sectional view taken along the line V-V' as shown in FIG. 1 to illustrate a connecting structure as shown in FIG. 1.

Referring to FIG. 5, the connecting structure 162 may be formed simultaneously with the gate structures 122, and may include a second gate electrode 166 connected to the gate electrodes 126, a second gate insulating layer 164 formed between the second gate electrode 166 and the well contact region 152, and second gate spacers 168 formed on side surfaces of the second gate electrode 166.

The gate contact region 160 may be formed simultaneously with the gate electrodes 126 and the second gate electrode 166. Specifically, after the well region 150 and the well contact region 152 are formed, the gate insulating layers 124 and the second gate insulating layer 164 may be formed on the well region 150 and the well contact region 152. For example, the gate insulating layers 124 and the second gate insulating layer 164 may be formed by a thermal oxidation process.

Then, a conductive layer (not shown) such as an impurity-doped polysilicon layer may be formed on the substrate 110, and the gate electrodes 126, the second gate electrode 166, and the gate contact region 160 may be formed by patterning the conductive layer. The gate spacers 128 and the second gate spacers 168 may be formed on the side surfaces of the gate electrodes 126 and the side surfaces of the second gate electrode 166, respectively. At this time, third spacers (not shown) may be formed simultaneously with the gate spacers 128 and the second gate spacers 168 on side surfaces of the gate contact region 160.

Further, gate contact plugs 170 may be formed on the gate contact region 160, and well contact plugs 154 may be formed on the well contact region 152. The gate contact plugs 170 and the well contact plugs 154 may be formed simultaneously with the first contact patterns 134.

The impurity regions 120 may be formed in the well region 150 by an ion implantation process, and may have a shorter length than the gate structures 122. For example, the ion implantation process for forming the impurity regions 120 may be performed in a self-aligning method using the gate electrodes 126 and the second gate electrode 166, or the gate structures 122 and the connecting structure 162.

Figure 6:
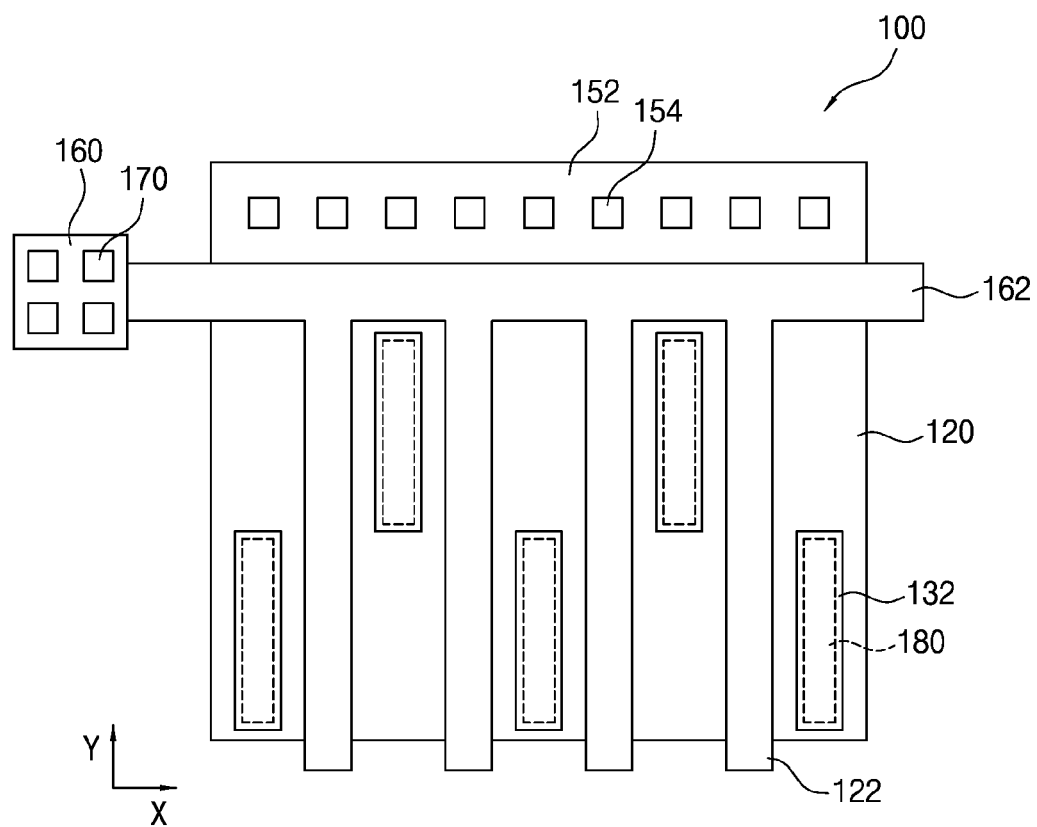
FIG. 6 is a schematic plan view illustrating a semiconductor device in accordance with another embodiment of the present disclosure.

FIG. 6 is a schematic plan view illustrating a semiconductor device in accordance with another embodiment of the present disclosure.

In accordance with another embodiment of the present disclosure, as shown in FIG. 6, the semiconductor device 100 may include first contact patterns 180 having a shorter length than the first wiring patterns 132. Further, the first wiring patterns 132 and the first contact patterns 180 may be disposed in a zigzag shape in the first direction. Accordingly, the distance between the first contact patterns 180 may be increased, and thereby the off-state capacitance of the semiconductor device 100 may be greatly reduced.

Although the example embodiments of the present invention have been described with reference to the specific embodiments, they are not limited thereto. Therefore, it will be readily understood by those skilled in the art that various modifications and changes can be made thereto without departing from the spirit and scope of the present disclosure defined by the appended claims.

The invention claimed is:

1. A semiconductor device comprising:
a plurality of impurity regions formed in surface portions of a substrate, the impurity regions being arranged in a first direction and extending parallel with one another in a second direction perpendicular to the first direction;
a plurality of gate structures formed on surface portions of the substrate between the impurity regions and extending parallel to the impurity regions;
a first insulating layer formed on the impurity regions and the gate structures;
a plurality of first wiring patterns formed on the first insulating layer and extending parallel to the impurity regions; and
a plurality of first contact patterns connecting the impurity regions and the first wiring patterns through the first insulating layer and extending parallel to the impurity regions,
wherein the first wiring patterns are arranged in a zigzag shape in the first direction.

2. The semiconductor device of claim 1, wherein the first contact patterns have a length shorter than a length of the first wiring patterns.

3. The semiconductor device of claim 2, wherein the first contact patterns are arranged in a zigzag shape in the first direction.

4. The semiconductor device of claim 2, wherein the impurity regions have a length shorter than that of the gate structures.

5. The semiconductor device of claim 1, wherein the substrate comprises a lower semiconductor layer, an upper semiconductor layer, and a buried insulating layer disposed between the lower semiconductor layer and the upper semiconductor layer, and
the impurity regions are formed in surface portions of the upper semiconductor layer.

6. The semiconductor device of claim 5, further comprising:
a well region formed in the upper semiconductor layer,
wherein the impurity regions are formed on the well region.

7. The semiconductor device of claim 6, further comprising:
a device isolation pattern formed on the buried insulating layer and configured to define the well region.

8. The semiconductor device of claim 5, further comprising:
a connecting structure connected with end portions of the gate structures and extending in the first direction; and
a gate contact region connected with an edge portion of the connecting structure.

9. The semiconductor device of claim 8, further comprising:
a well region formed in the substrate; and
a well contact region connected with the well region,
wherein the impurity regions are formed on the well region, and
the connecting structure is formed on the well contact region.

10. The semiconductor device of claim 9, further comprising:
a device isolation pattern formed on the buried insulating layer and configured to define the well region and the well contact region.

* * * * *